US011411200B2

(12) United States Patent
Kim et al.

(10) Patent No.: US 11,411,200 B2
(45) Date of Patent: Aug. 9, 2022

(54) DISPLAY DEVICE HAVING A LIGHT-EMITTING ELEMENT AND A COLOR FILTER

(71) Applicant: LG Display Co., Ltd., Seoul (KR)

(72) Inventors: Moon-Soo Kim, Suncheon-si (KR); Sung-Bin Shim, Yangsan-si (KR); Choojin Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 128 days.

(21) Appl. No.: 16/199,655

(22) Filed: Nov. 26, 2018

(65) Prior Publication Data
US 2019/0165313 A1 May 30, 2019

(30) Foreign Application Priority Data
Nov. 28, 2017 (KR) .................. 10-2017-0160774

(51) Int. Cl.
  *H01L 51/52* (2006.01)
  *H01L 27/32* (2006.01)
(52) U.S. Cl.
  CPC ........ *H01L 51/5253* (2013.01); *H01L 27/322* (2013.01); *H01L 27/3246* (2013.01); *H01L 27/3267* (2013.01); *H01L 51/525* (2013.01); *H01L 51/5246* (2013.01)
(58) Field of Classification Search
  CPC ..... H01L 51/52; H01L 27/32; H01L 51/5253; H01L 51/5246; H01L 51/525; H01L 27/322; H01L 27/3246; H01L 27/3267

USPC .......................................................... 257/89
See application file for complete search history.

(56) References Cited

U.S. PATENT DOCUMENTS

| | | | | |
|---|---|---|---|---|
| 2010/0141116 | A1* | 6/2010 | Nomura | B29D 11/00634 313/498 |
| 2014/0070174 | A1* | 3/2014 | Kwon | H01L 51/50 257/40 |
| 2014/0284590 | A1* | 9/2014 | Nakazawa | G02B 5/201 257/40 |
| 2015/0277017 | A1* | 10/2015 | Aoyagi | H01L 51/5271 362/608 |
| 2016/0027859 | A1* | 1/2016 | Kim | H01L 25/048 257/88 |
| 2016/0293676 | A1* | 10/2016 | Komatsu | H01L 27/3213 |
| 2017/0123317 | A1* | 5/2017 | Kamura | G02B 5/201 |
| 2017/0133357 | A1* | 5/2017 | Kuo | H01L 25/0753 |
| 2019/0371987 | A1* | 12/2019 | Perkins | H01L 33/42 |

* cited by examiner

*Primary Examiner* — Sheng-Bai Zhu
(74) *Attorney, Agent, or Firm* — Birch, Stewart, Kolasch & Birch, LLP

(57) ABSTRACT

A front emission type display device is provided. In the display device, light generated by a light-emitting element which is disposed on a first substrate can be emitted to the outside through a color filter and a second substrate, so that an image can be realized on an outer surface of the second substrate. In the display device, a space between a first device passivation layer on the light-emitting element, and a second device passivation layer on the second substrate can be filled by the color filter and a pixel defining pattern disposed on a side surface of the color filter. Thus, in the display device, the distortion of the first substrate and the second substrate can be prevented or reduced.

19 Claims, 9 Drawing Sheets

DISPLAY DEVICE HAVING A LIGHT-EMITTING ELEMENT AND A COLOR FILTER

CROSS-REFERENCE TO RELATED APPLICATION

This application claims the priority benefit of Korean Patent Application No. 10-2017-0160774, filed on Nov. 28, 2017 in the Korean Intellectual Property Office, which is hereby incorporated by reference as if fully set forth herein.

BACKGROUND OF THE INVENTION

Field of the Invention

The present invention relates to a display device realizing an image using a light-emitting element and a color filter.

Discussion of the Related Art

Generally, an electronic appliance, such as a monitor, a TV, a laptop computer and a digital camera, includes a display device to realize an image. For example, the display device can be a self-luminous device including light-emitting elements. The light-emitting elements can generate light. For example, each of the light-emitting elements can include a first electrode, a light-emitting layer and a second electrode, which are sequentially stacked.

The display device can further comprise color filters to realize a specific color using the light generated by each light-emitting element. For example, the color filters can overlap the light-emitting elements. Each of the color filters can realize a color different from adjacent color filters. For example, the display device can comprise a red color filter displaying red color, a green color filter displaying green color, and a blue color filter displaying blue color.

In the display device, the color filters can be disposed on a substrate different from the light-emitting elements. For example, the display device can include a first substrate supporting the light-emitting elements, and a second substrate supporting the color filters. In the display device, the light generated by the light-emitting elements can be emitted to the outside through the second substrate.

A space between the first substrate and the second substrate can be filled by a filling member. The filling member can include a transparent material. However, the filling member having high transparency can have a relatively low rigidity. Thus, in the display device, the distortion between the first substrate and the second substrate due to external impact can occur. In the display device, a path and an emitting location of the light emitted by the light-emitting element can be changed due to the distortion between the first substrate and the second substrate. Therefore, in the display device, the color sense of the light emitted to the outside and the quality of the image can be decreased.

SUMMARY OF THE INVENTION

Accordingly, the present invention is directed to a display device that substantially obviates one or more problems due to limitations and disadvantages of the related art.

An object of the present invention is to provide a display device capable of preventing or reducing the distortion between the first substrate and the second substrate due to the external impact.

Another object of the present invention is to provide a display device in which a distance between the light-emitting element on the first substrate, and the second substrate in which the light generated by the light-emitting element is emitted, can be maintained.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided a display device including a light-emitting element on a first substrate. A first device passivation layer is disposed on the light-emitting element. A color filter and a filling member are disposed on the first device passivation layer. The color filter overlaps the light-emitting element. The filling member surrounds a side surface of the color filter. A second device passivation layer is disposed on the color filter and the filling member. A pixel defining pattern is disposed and extends between the first device passivation layer and the second device passivation layer. The pixel defining pattern is extended and interposed between the color filter and the filling member. A second substrate is disposed on the second device passivation layer. A vertical length of the pixel defining pattern is greater than a vertical distance between the first device passivation layer and the second device passivation layer.

The light-emitting element can include a first electrode, a light-emitting layer and a second electrode, which are sequentially stacked. The pixel defining pattern can include an end portion being in direct contact with the second electrode.

A horizontal width of the pixel defining pattern can be reduced away from the first device passivation layer towards the second device passivation layer.

An edge of the first electrode can be covered by a bank insulating layer. The pixel defining pattern can overlap the bank insulating layer.

A side surface of the pixel defining pattern can include a first side surface and a second side surface having an inclination angle different from the first side surface. The second side surface of the pixel defining pattern can be in direct contact with the second device passivation layer.

The inclination angle of the second side surface can be smaller than the inclination angle of the first side surface.

A vertical distance of the second side surface can be smaller than a vertical distance of the second device passivation layer.

The pixel defining pattern can include a material harder than the filling member.

In another embodiment, the display device includes a first color filter between a first substrate and a second substrate. A first pixel defining pattern is disposed on a side surface of the first color filter. A first light-emitting element is disposed between the first substrate and the first color filter. A first device passivation layer is disposed between the first light-emitting element and the first color filter. The first device passivation layer surrounds a first pattern end of the first pixel defining pattern. A second device passivation layer is disposed between the first color filter and the second substrate. The second device passivation layer surrounds a second pattern end of the first pixel defining pattern.

The first pixel defining pattern can include a black based material.

The first color filter can be in direct contact with the first pixel defining pattern, the first device passivation layer and the second device passivation layer.

A horizontal width of the first pattern end can be smaller than a horizontal width of the second pattern end.

A second color filter can be disposed between the first substrate and the second substrate. The second color filter can be spaced away from the first color filter. A second pixel defining pattern can be disposed on a side surface of the second color filter. The second pixel defining pattern can be spaced away from the first pixel defining pattern. A second light-emitting element can be disposed between the second device passivation layer and the second substrate. The second light-emitting element can overlap the second color filter. The second pixel defining pattern can be symmetric with the first pixel defining pattern.

A filling member can be disposed between the first device passivation layer and the second device passivation layer. The filling member can surround the first pixel defining pattern and the second pixel defining pattern.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
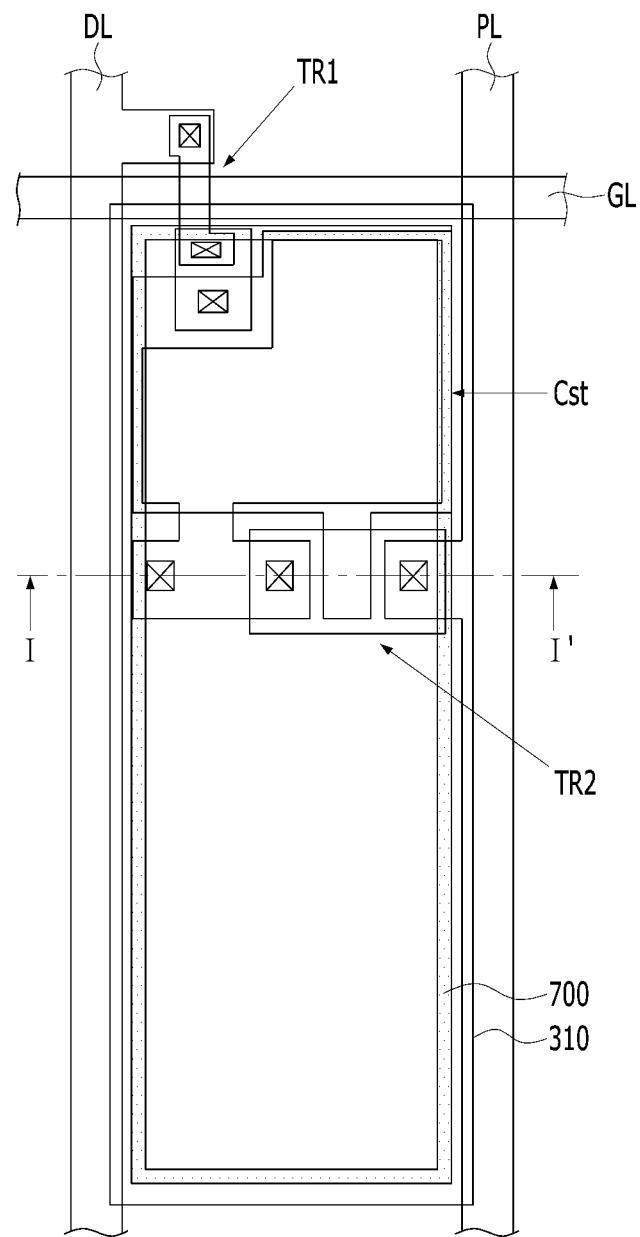
FIG. 1 is a view schematically showing a display device according to an embodiment of the present invention.

Hereinafter, details related to the above objects, technical configurations, and operational effects of the embodiments of the present invention will be clearly understood by the following detailed description with reference to the drawings, which illustrate embodiments of the present invention. Here, the embodiments of the present invention are provided in order to allow the technical sprit of the present invention to be satisfactorily transferred to those skilled in the art, and thus the present invention can be embodied in other forms and is not limited to the embodiments described below.

In addition, the same or extremely similar elements can be designated by the same reference numerals throughout the specification, and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element.

However, the first element and the second element can be arbitrary named according to the convenience of those skilled in the art without departing from the technical sprit of the embodiments of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
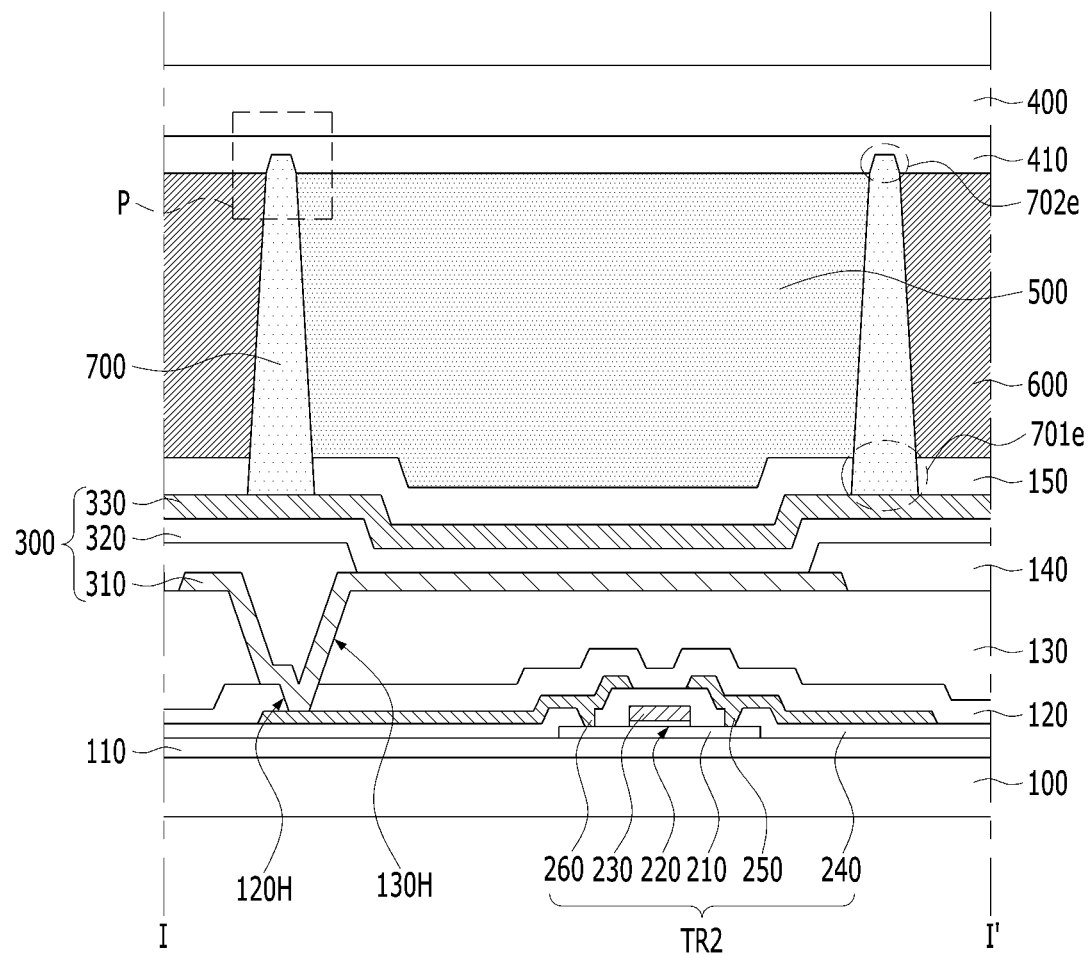
FIG. 2 is a view taken along I-I' of FIG. 1.
Figure 3:
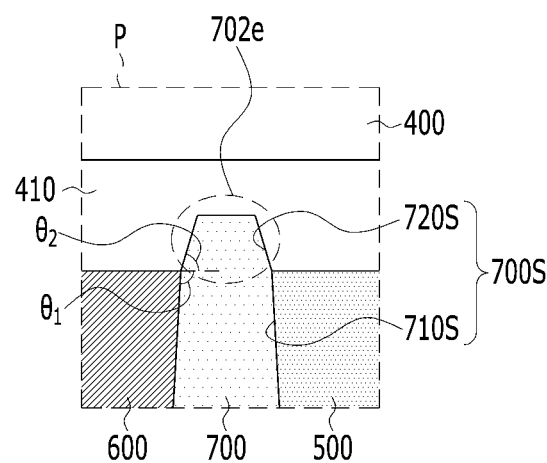
FIG. 3 is an enlarged view of a region P in FIG. 2.

FIG. 1 is a view schematically showing a display device according to an embodiment of the present invention. FIG. 2 is a view taken along I-I' of FIG. 1. FIG. 3 is an enlarged view of a region P in FIG. 2.

Referring to FIGS. 1 to 3, the display device according to the embodiment of the present invention can include a first substrate 100. The first substrate 100 can include an insulating material. For example, the first substrate 100 can include glass or plastic.

Signal lines GL, DL and PL can be disposed on the first substrate 100. For example, the signal lines GL, DL and PL can include a gate line GL, a data line DL and a power supply line PL. The gate line GL can be extended in a direction. The data line DL can intersect the gate line GL. The power supply line PL can intersect the gate line GL or the data line DL. For example, the power supply line PL can be parallel with the data line DL.

The signal lines GL, DL and PL can define a pixel region. A driving circuit can be disposed in the pixel region. For example, the display device according to the embodiment of the present invention can include a switching thin film transistor TR1, a driving thin film transistor TR2 and a storage capacitor Cst which can be disposed in a space defined by the signal lines GL, DL and PL.

A structure of the driving thin film transistor TR2 can be the same as a structure of the switching thin film transistor TR1. For example, the switching thin film transistor TR1 and the driving thin film transistor TR2 can include a semiconductor pattern 210, a gate insulating layer 220, a gate electrode 230, an interlayer insulating layer 240, a source electrode 250 and a drain electrode 260, respectively.

The semiconductor pattern 210 can be disposed close to the first substrate 100. The semiconductor pattern 210 can include a semiconductor material. For example, the semiconductor pattern 210 can include amorphous silicon or poly-silicon. The semiconductor pattern 210 can be an oxide semiconductor. For example, the semiconductor pattern 210 can include IGZO. Other materials can also be used.

The semiconductor pattern 210 can include a source region, a drain region and a channel region. The channel region can be disposed between the source region and the drain region. The conductivity of the channel region can be lower than the conductivities of the source region and the drain region.

The gate insulating layer 220 can be disposed on the semiconductor pattern 210. The gate insulating layer 220 can partially cover an upper surface of the semiconductor pattern 210 opposite to the first substrate 100. For example, the gate insulating layer 220 can overlap the channel region of the semiconductor pattern 210.

The gate insulating layer 220 can include an insulating material. For example, the gate insulating layer 220 can include silicon oxide and/or silicon nitride. The gate insulating layer 220 can include a high-K material. For example, the gate insulating layer 220 can include hafnium oxide (HfO) or titanium oxide (TiO). The gate insulating layer 220 can have a multi-layer structure.

The gate electrode 230 can be disposed on the gate insulating layer 220. The gate electrode 230 can be insulated from the semiconductor pattern 210 by the gate insulating layer 220. For example, a side surface of the gate electrode 230 can be continuous with a side surface of the gate insulating layer 220. The gate electrode 230 can overlap the channel region of the semiconductor pattern 210.

The interlayer insulating layer 240 can be disposed on the semiconductor pattern 210 and the gate electrode 230. The interlayer insulating layer 240 can be extended beyond the semiconductor pattern 210. For example, the interlayer insulating layer 240 of the driving thin film transistor TR2 can be coupled to the interlayer insulating layer 240 of the switching thin film transistor TR1.

The interlayer insulating layer 240 can include an insulating material. For example, the interlayer insulating layer 240 can include silicon oxide or silicon nitride.

The source electrode 250 and the drain electrode 260 can be disposed on the interlayer insulating layer 240. The source electrode 250 can be electrically connected to the source region of the semiconductor pattern 210. The drain electrode 260 can be electrically connected to the drain region of the semiconductor pattern 210. The drain electrode 260 can be spaced away from the source electrode 250. For example, the interlayer insulating layer 240 can include a contact hole exposing the source region of the semiconductor pattern 210, and a contact hole exposing the drain region of the semiconductor pattern 210.

The source electrode 250 and the drain electrode 260 can include a conductive material. For example, the source electrode 250 and the drain electrode 260 can include a metal, such as aluminum (Al), chrome (Cr), copper (Cu), titanium (Ti), molybdenum (Mo) and tungsten (W). The drain electrode 260 can include a material the same as the source electrode 250. The gate electrode 230 can include a conductive material different from the source electrode 250 and the drain electrode 260.

The switching thin film transistor TR1 can be controlled by a gate signal applied by the gate line GL. For example, the gate electrode 230 of the switching thin film transistor TR1 can be electrically connected to the gate line GL. The gate electrode 230 of the driving thin film transistor TR2 can be electrically connected to the switching thin film transistor TR1. For example, the switching thin film transistor TR1 can supply a data signal applied by the data line DL to the gate electrode 230 of the driving thin film transistor TR2 according to the gate signal. The driving thin film transistor TR2 can generate a driving current according to the data signal. The storage capacitor Cst can maintain the operation of the driving thin film transistor TR2 during a single frame.

A buffer layer 110 can be disposed between the first substrate 100 and the driving circuit. For example, the buffer layer 110 can be extended between the first substrate 100 and the switching thin film transistor TR1, and between the first substrate 100 and the driving thin film transistor TR2. The surface of the first substrate 100 can be covered by the buffer layer 110, entirely.

The buffer layer 110 can include an insulating material. For example, the buffer layer 110 can include silicon oxide.

A lower passivation layer 120 can be disposed on the driving circuit. The lower passivation layer 120 can prevent or reduce the damage of the driving circuit due to the external impact and moisture. The lower passivation layer 120 can be extended beyond the driving circuit. For example, the switching thin film transistor TR1, the driving thin film transistor TR2 and the storage capacitor Cst can be covered by the lower passivation layer 120.

The lower passivation layer 120 can include an insulating material. For example, the lower passivation layer 120 can include silicon oxide and/or silicon nitride. The lower passivation layer 120 can have a multi-layer structure.

An over-coat layer 130 can be disposed on the lower passivation layer 120. The over-coat layer 130 can remove a thickness difference due to the driving circuit. For example, an upper surface of the over-coat layer 130 opposite to the first substrate 100 can be a flat surface.

The over-coat layer 130 can include an insulating material. The over-coat layer 130 can include a material different from the lower passivation layer 120. For example, the over-coat layer 130 can include an organic insulating material.

A light-emitting element 300 can be disposed on the over-coat layer 130. The light-emitting element 300 can generate light realizing a specific color. For example, the light-emitting element 300 can include a first electrode 310, a light-emitting layer 320 and a second electrode 330, which can be sequentially stacked on the over-coat layer 130.

The first electrode 310 can be in direct contact with the over-coat layer 130. The light-emitting element 300 can be controlled by the driving circuit. For example, the first electrode 310 can be electrically connected to the drain electrode 260 of the driving thin film transistor TR2. The lower passivation layer 120 can include a lower contact hole 120H partially exposing the drain electrode 260 of the driving thin film transistor TR2. The over-coat layer 130 can include an over contact hole 130H overlapping with the lower contact hole 120H. The first electrode 310 can be extended along a side wall of the over contact hole 130H and a side wall of the lower contact hole 120H.

The first electrode 310 can include a conductive material. The first electrode 310 can include a material having high reflectivity. For example, the first electrode 310 can include a metal, such as aluminum (Al) and silver (Ag). The first electrode 310 can have a multi-layer structure. For example, the first electrode 310 can have a structure in which a reflective electrode formed of a material having a high reflectivity can be disposed between transparent electrodes formed of a transparent material, such as ITO and IZO.

The light-emitting layer 320 can generate light having luminance corresponding to a voltage difference between the first electrode 310 and the second electrode 330. For example, the light-emitting layer 320 can include an emitting material layer (EML) having an emission material. The emission material can be an inorganic material, an organic material or a hybrid material. For example, the display device according to the embodiment of the present invention can be an organic light-emitting display device having the light-emitting layer 320 formed of the organic material.

The light-emitting layer 320 can have a multi-layer structure in order to increase luminous efficiency. For example, the light-emitting layer 320 can further include at least one of a hole injection layer (HIL), a hole transporting layer (HTL), an electron transporting layer (ETL) and an electron injection layer (EIL).

The second electrode 330 can include a conductive material. The second electrode 330 can include a material different from that of the first electrode 310. For example, the second electrode 330 can be a transparent electrode. Thus, in the display device according to the embodiment of the present invention, the light generated by the light-emitting layer 320 can be emitted to outside through the second electrode 330.

An edge of the first electrode 310 can be covered by a bank insulating layer 140. The light-emitting layer 320 and the second electrode 330 can be stacked on a portion of the first electrode 310 which can be exposed by the bank insulating layer 140. The first electrode 310 of each light-emitting element 300 can be insulated from the first electrodes 310 of adjacent light-emitting elements 300. Thus, in the display device according to the embodiment of the present invention, each of the light-emitting elements 300 can be driven, independently.

The bank insulating layer 140 can include an insulating material. For example, the bank insulating layer 140 can include an organic insulating material. The bank insulating layer 140 can include a material different from that of the over-coat layer 130.

A first device passivation layer 150 can be disposed on the light-emitting element 300. The first device passivation layer 150 can be extended along the second electrode 330. Thus, in the display device according to the embodiment of the present invention, the damage of the light-emitting element 300 due to the external impact and moisture can be prevented or reduced.

The first device passivation layer 150 can include an insulating material. For example, the first device passivation layer 150 can include an organic material and/or an inorganic material. The first device passivation layer 150 can have a multi-layer structure. For example, the first device passivation layer 150 can have a structure in which an organic layer formed of an organic material can be disposed between inorganic layers formed of an inorganic material.

A second substrate 400 can be disposed on the first device passivation layer 150. The second substrate 400 can be opposite to the first substrate 100. For example, the signal lines GL, DL and PL, the driving circuit and the light-emitting element 300 can be disposed between the first substrate 100 and the second substrate 400.

The second substrate 400 can include an insulating material. The second substrate 400 can include a transparent material. For example, the second substrate 400 can include glass or plastic. Thus, in the display device according to the embodiment of the present invention, an image can be realized on an outer surface of the second substrate 400 by the light generated by the light-emitting elements 300.

A second device passivation layer 410 can be disposed on a surface of the second substrate 400 facing the first substrate 100. For example, the second device passivation layer 410 can be in direct contact with the second substrate 400. The second device passivation layer 410 can be extended along the surface of the second substrate 400.

The second device passivation layer 410 can include an insulating material. For example, the second device passivation layer 410 can include silicon oxide and/or silicon nitride. The second device passivation layer 410 can have a structure different from that of the first device passivation layer 150. For example, the second device passivation layer 410 can have a single layer structure.

A color filter 500 can be disposed between the first device passivation layer 150 and the second device passivation layer 410. The color filter 500 can overlap the light-emitting element 300. For example, the color filter 500 can overlap the portion of the first electrode 310 exposed by the bank insulating layer 140. The light generated by the light-emitting element 300 can travel toward the second substrate 400 passing through the color filter 500. Thus, the display device according to the embodiment of the present invention can realize various colors using the light generated by the light-emitting element 300.

The color filter 500 can completely fill a space between the first device passivation layer 150 and the second device passivation layer 410. For example, the color filter 500 can include a lower surface being in direct contact with the first device passivation layer 150, and an upper surface being in direct contact with the second device passivation layer 410. Thus, in the display device according to the embodiment of the present invention, the distance between the first device passivation layer 150 and the second device passivation layer 410 can be maintained by the color filter 500. Also, in the display device according to the embodiment of the present invention, the distortion between the first substrate 100 and the second substrate 400 due to the external impact can be relieved by the color filter 500.

A filling member 600 can be disposed on a side surface of the color filter 500. For example, the filling member 600 can surround the color filter 500. The filling member 600 can be in direct contact with a surface of the first device passivation layer 150 facing the second substrate 400, and a surface of the second device passivation layer 410 facing the first substrate 100. Thus, in the display device according to the embodiment of the present invention, the distance between the first substrate 100 and the second substrate 400 can be maintained by the color filter 500 and the filling member 600. And, in the display device according to the embodiment of the present invention, the distortion between the first substrate 100 and the second substrate 400 due to the external impact can be relieved by the color filter 500 and the filling member 600.

The filling member 600 can include an insulating material. The filling member 600 can include a transparent material. For example, the filling member 600 can include a thermosetting resin. The filling member 600 can include an adhesive material. For example, the second substrate 400 on which the second device passivation layer 410 can be formed, can be coupled to the first substrate 100 on which the light-emitting element 300, the first device passivation layer 150 and the color filter 500 can be formed, by the filling member 600.

A pixel defining pattern 700 can be disposed between the color filter 500 and the filling member 600. For example, the pixel defining pattern 700 can overlap the bank insulating layer 140. Between the first device passivation layer 150 and the second device passivation layer 410, the pixel defining pattern 700 can be extended between the color filter 500 and the filling member 600. The side surface of the color filter 500 can be in direct contact with the pixel defining pattern 700. For example, the pixel defining pattern 700 can be a closed loop shape extended along the side surface of the color filter 500. The space between the first device passivation layer 150 and the second device passivation layer 410 can be completely filled by the color filter 500, the filling member 600 and the pixel defining pattern 700.

A vertical length of the pixel defining pattern 700 can be larger than a vertical distance between the first device passivation layer 150 and the second device passivation layer 410. For example, the pixel defining pattern 700 can include a first pattern end 701e extended to the inside of the first device passivation layer 150, and a second pattern end 702e extended to the inside of the second device passivation layer 410. The first device passivation layer 150 can surround the first pattern end 701e of the pixel defining pattern 700. The second device passivation layer 410 can surround the second pattern end 702e of the pixel defining pattern 700. Thus, in the display device according to the embodiment of the present invention, the distortion between the first substrate 100 and the second substrate 400 can be prevented or reduced by the pixel defining pattern 700.

The first pattern end (e.g., a wider end) 701e of the pixel defining pattern 700 can penetrate the first device passivation layer 150. For example, the first pattern end 701e can be in direct contact with the second electrode 330. A horizontal width of the first pattern end 701e can be larger than a horizontal width of the second pattern end 702e. For example, a horizontal width of the pixel defining pattern 700 can be sequentially reduced from the first device passivation layer 150 toward the second device passivation layer 410. Thus, in the display device according to the embodiment of the present invention, the distortion between the first substrate 100 and the second substrate 400 can be prevented or reduced, efficiently. In embodiments of the present invention, the pixel defining pattern 700 can include a narrower end (e.g., the second pattern end 702e) and the wider end (e.g., the first pattern end 701e). The second pattern end 702e can penetrate into the second device passivation layer 410 without piercing the second device passivation layer 410. In embodiments of the present invention, the first pattern end 701e can pierce the first device passivation layer 150. In embodiments of the present invention, the pixel defining pattern 700 can be on the light-emitting element 300, and be aligned with the light-emitting element 300.

A side surface 700S of the pixel defining pattern 700 can include a first side 710S and a second side 720S. The second side 720S can be disposed close to the second substrate 400. For example, the second side 720S can be in direct contact with the second device passivation layer 410. The second side 720S can be a side surface of the second pattern end 702e.

The second side 720S can have an inclination angle different from that of the first side 710S. For example, the inclination angle θ2 of the second side 720S can be smaller than the inclination angle θ1 of the first side 710S. The horizontal width of the second pattern end 702e can be reduced as it approaches the second substrate 400. Thus, in the display device according to the embodiment of the present invention, the second pattern end 702e of the pixel defining pattern 700 can be easily inserted to the inside of the second device passivation layer 410 by a coupling process between the first substrate 100 and the second substrate 400. For example, a method of forming the display device according to the embodiment of the present invention can include an operation of pressing the first substrate 100 in which the light-emitting element 300, the first device passivation layer 150, the color filter 500 and the pixel defining pattern 700 can be formed, and the second substrate 400 in which the second device passivation layer 410 to couple the first substrate 100 and the second substrate 400 using the filling member 600. Thus, in the method of forming the display device according to the embodiment of the present invention, the second pattern end 702e of the pixel defining pattern 700 can be inserted into the second device passivation layer 410 by the pressure for coupling between the first substrate 100 and the second substrate 400. Therefore, in the display device according to the embodiment of the present invention, the distortion between the first substrate 100 and the second substrate 400 can be prevented or reduced without adding a complicating process.

A vertical length of the second pattern end 702e can be smaller than a vertical distance of the second device passivation layer 410. For example, the second pattern end 702e of the pixel defining pattern 700 can be spaced away from the second substrate 400. Thus, in the display device according to the embodiment of the present invention, the damage of the second pattern end 702e of the pixel defining pattern 700 due to the pressure for coupling between the first substrate 100 and the second substrate 400 can be prevented or reduced. Therefore, in the display device according to the embodiment of the present invention, deform and/or the damage of the color filter 500 due to deform of the pixel defining pattern 700 can be prevented or reduced.

The pixel defining pattern 700 can include an insulating material. The pixel defining pattern 700 can include a curing material. For example, the pixel defining pattern 700 can include a thermosetting resin. The pixel defining pattern 700 can include a material harder than the filling member 600. Thus, in the display device according to the embodiment of the present invention, the distortion between the first substrate 100 and the second substrate 400 can be efficiently prevented or reduced by the pixel defining pattern 700.

The pixel defining pattern 700 can include a black based material. For example, the pixel defining pattern 700 can function as a black matrix. Thus, in the display device according to the embodiment of the present invention, the light proceeding to adjacent pixel region can be blocked by the pixel defining pattern 700. Therefore, in the display device according to the embodiment of the present invention, light leakage can be prevented or reduced.

Accordingly, the display device according to the embodiment of the present invention can prevent or reduce the distortion between the first substrate 100 and the second substrate 400 by the pixel defining pattern 700 including end portions inserted to the first device passivation layer 150 and the second device passivation 410, and the color filter 500 completely filling the space defined by the pixel defining pattern 700. Thereby, in the display device according to the embodiment of the present invention, the degradation of the color sense and the quality of the realized image due to the external impact can be prevented or reduced.

Figure 4:
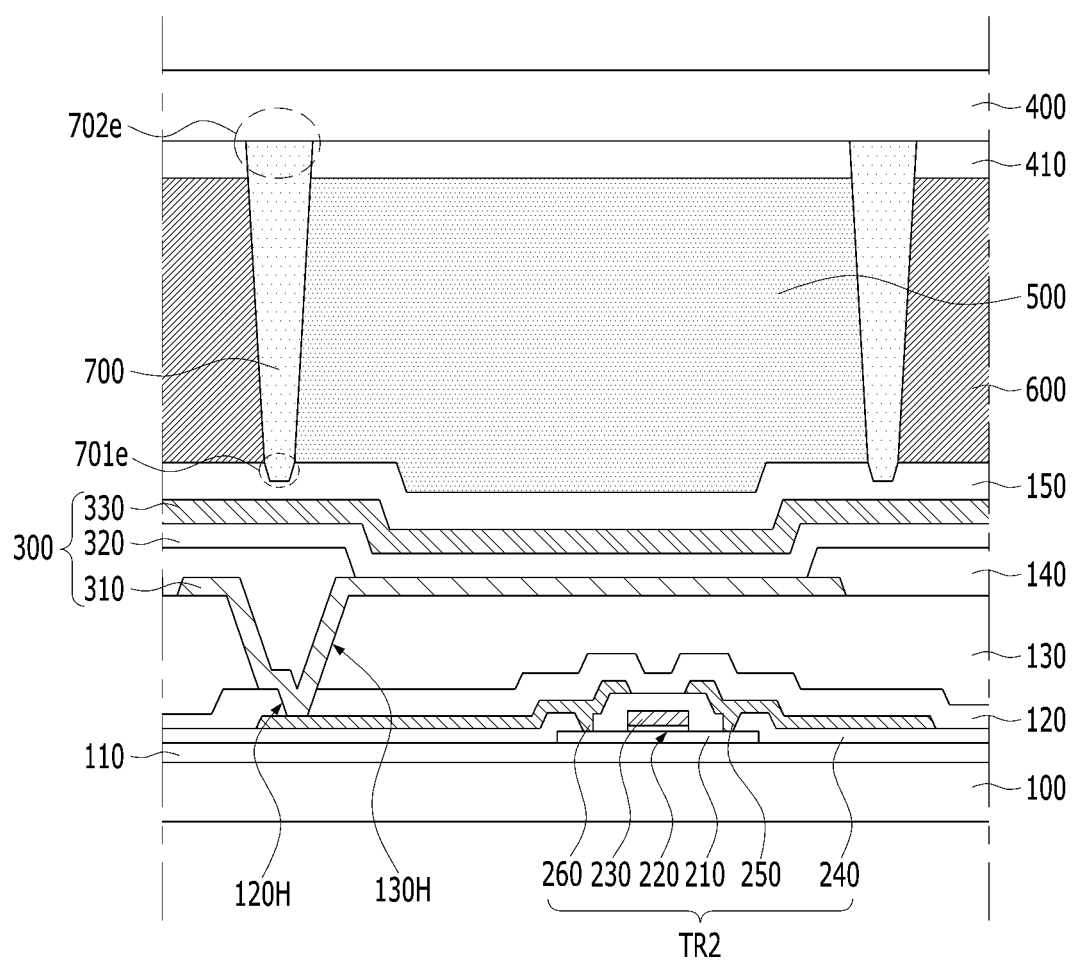
FIGS. 4 to 7 are views respectively showing the display device according to another embodiment of the present invention.

The display device according to the embodiment of the present invention is described that the first pattern end 701e of the pixel defining pattern 700 which can be disposed close to the first substrate 100, has a horizontal width relatively larger. However, in the display device according to another embodiment of the present invention, the second pattern end 702e of the pixel defining pattern 700 which can be disposed close to the second substrate 400 can penetrate the second device passivation layer 410, as shown in FIG. 4. For example, in the display device according to another embodiment of the present invention, the second pattern end 702e of the pixel defining pattern 700 can be in direct contact with the second substrate 400. Thus, in the display device according to another embodiment of the present invention, a horizontal width of the pixel defining pattern 700 can be increased from the first substrate 100 toward the second substrate 400. In the display device according to another embodiment of the present invention, a vertical length of the first pattern end 701e of the pixel defining pattern 700 can be smaller than a vertical distance of the first device passivation layer 150. For example, in the display device according to another embodiment of the present invention, the first pattern end 701e of the pixel defining pattern 700 can be spaced away from the second electrode 330 of the light-emitting element 300. A method of forming the display device according to another embodiment of the present invention can include an operation of coupling between the first substrate 100 in which the light-emitting element 300 and the first device passivation layer 150 can be formed, and the second substrate 400 in which the second device passivation layer 410 and the color filter 500 can be formed, using the filling member 600. Thus, in the display device according to another embodiment of the present invention, the damage of the light-emitting element 300 due to a process of forming the color filter 500 and the pixel defining pattern 700 can be prevented or reduced.

Figure 5:
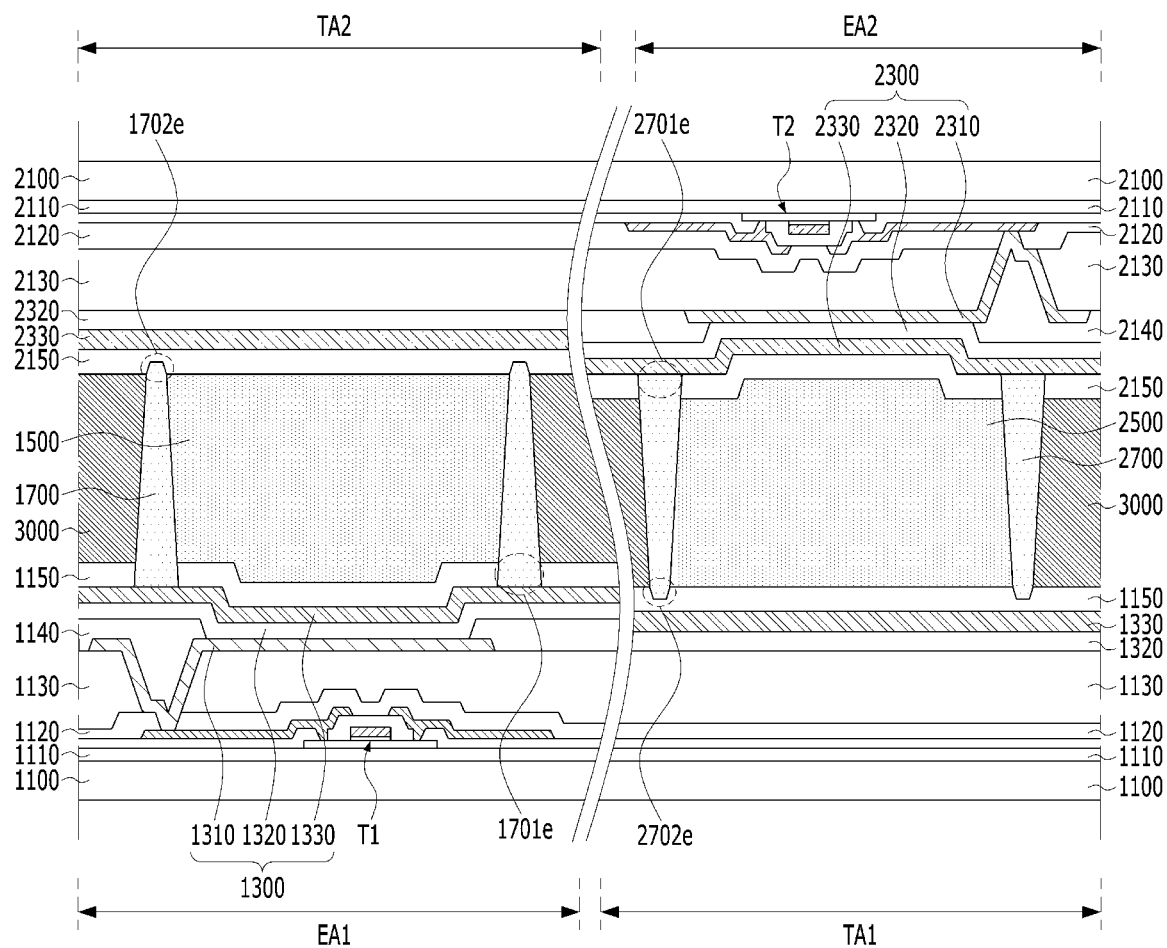

The display device according to the embodiment of the present invention is described that the light generated by the light-emitting element 300 realizes the image on the outer surface of the second substrate 400. However, the display device according to another embodiment of the present invention can be a dual display device realizing the image on the outer surfaces of the first substrate 100 and the second substrate 400. For example, in the display device according to another embodiment of the present invention, a first light-emitting element 1300 and a first color filter 1500 can be sequentially stacked on a first emission region EA1 of the first substrate 1100, a second light-emitting element 2300 and a second color filter 2500 can be sequentially stacked on a second emission region EA2 of the second substrate 2100 opposite to the first substrate 1100, the second emission region EA2 of the second substrate 2100 can overlap a first transmission region TA1 of the first substrate 1100, and the first emission region EA1 of the first substrate 1100 can overlap a second transmission region TA2 of the second substrate 2100, as shown in FIG. 5. Thus, in the display device according to another embodiment of the present invention, the light generated by the first light-emitting element 1300 can realize the image on the outer surface of the second substrate 2100, and the light generated by the second light-emitting element 2300 can realize the image on the outer surface of the first substrate 1100.

In the display device according to another embodiment of the present invention, the image realized on the outer surface of the first substrate 1100 can be different from that of the image realized on the outer surface of the second substrate 2100. For example, in the display device according to another embodiment of the present invention, a buffer layer 1110, a first driving thin film transistor T1, a first lower passivation layer 1120 and a first over-coat layer 1130 can be disposed between the first substrate 1100 and the first light-emitting element 1300, and a second buffer layer 2110, a second driving thin film transistor T2, a second lower passivation layer 2120 and a second over-coat layer 2130 can be disposed between the second substrate 2100 and the second light-emitting element 2300. The second light-emitting element 2300 can have a structure the same as the first light-emitting element 1300. For example, the first light-emitting element 1300 can include a first lower electrode 1310, a first light-emitting layer 1320 and a first upper electrode 1330, which can be sequentially stacked on the first over-coat layer 1130, and the second light-emitting element 2300 can include a second lower electrode 2310, a second light-emitting layer 2320 and a second upper electrode 2330, which can be stacked on the second over-coat layer 2130. An edge of the first lower electrode 1310 can be covered by a first bank insulating layer 1140. An edge of the second lower electrode 2310 can be covered by a second bank insulating layer 2140. A first device passivation layer 1150 can be disposed between the first light-emitting element 1300 and the first color filter 1500, and a second device passivation layer 2150 can be disposed between the second light-emitting element 2300 and the second color filter 2500. A structure of the second device passivation layer 2150 can be the same as a structure of the first device passivation layer 1150.

A first pixel defining pattern 1700 can be disposed on a side surface of the first color filter 1500. The first pixel defining pattern 1700 can include a first pattern end 1701e penetrating the first device passivation layer 1150. The second device passivation layer 2150 can be extended on the second transmission region TA2 of the second substrate 2100. For example, a second pattern end 1702e of the first pixel defining pattern 1700 can be surrounded by the second device passivation layer 2150. A vertical length of the second pattern end 1702e of the first pixel defining pattern 1700 can be lower than a vertical distance of the second device defining pattern 2150. For example, a horizontal width of the first pixel defining pattern 1700 can be reduced from the first substrate 1100 toward the second substrate 2100.

A second pixel defining pattern 2700 can be disposed on a side surface of the second color filter 2500. The second pixel defining pattern 2700 can be symmetric with the first pixel defining pattern 1700. For example, a horizontal width of the second pixel defining pattern 2700 can be reduced from the second substrate 2100 toward the first substrate 1100. The first device passivation layer 1150 can be extended on the first transmission region TA1 of the first substrate 1100. For example, the second pixel defining pattern 2700 can include a first pattern end 2701e penetrating the second device passivation layer 2150, and a second pattern end 2702e surrounded by the first device passivation layer 1150.

A space among the first device passivation layer 1150, the second device passivation layer 2150, the first pixel defining pattern 1700 and the second pixel defining pattern 2700 can be completely filled by the filling member 3000. Thus, in the display device according to another embodiment of the present invention, the degradation of the quality of the image realized on the outer surface of the first substrate 1100 and the image realized on the outer surface of the second substrate 2100 due to the external impact can be prevented or reduced.

Figure 6:
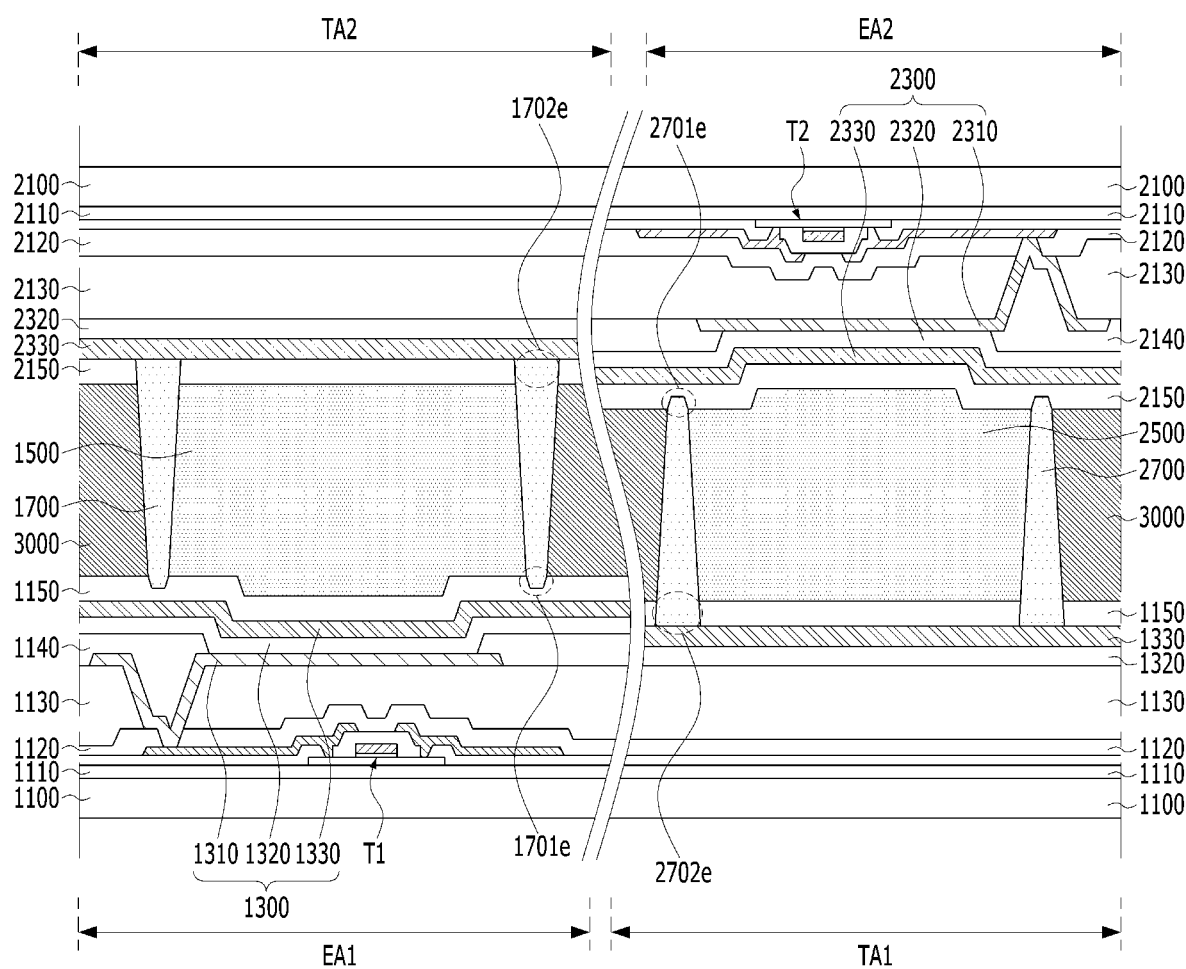

The display device according to another embodiment of the present invention is described that the horizontal widths of the first pixel defining pattern 1700 and the second pixel defining pattern 2700 can be reduced as it can be far away from the corresponding light-emitting element 1300 and 2300. However, in the display device according to yet another embodiment of the present invention, the first pattern end 1701e and 2701e of the first pixel defining pattern 1700 and the second pixel defining pattern 2700 which can be disposed close to the corresponding light-emitting element 1300 and 2300 can have a horizontal width relatively smaller, as shown in FIG. 6. Thus, in the display device according to yet another embodiment of the present invention, the damage of the light-emitting element 1300 and 2300 due to the process of forming the color filters 1500 and 2500, and the pixel defining patterns 1700 and 2700 can be prevented or reduced.

Figure 7:
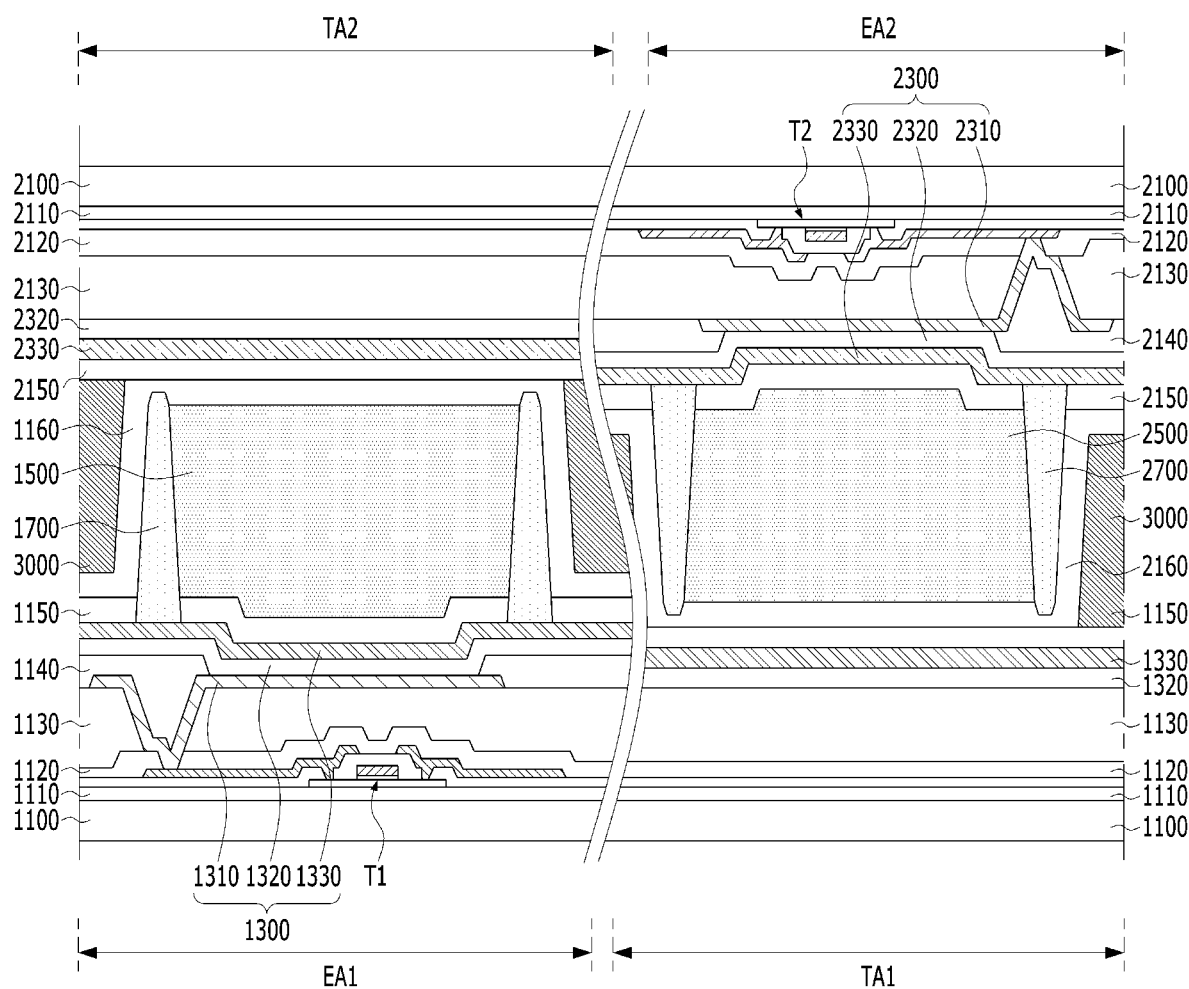

The display device according to another embodiment of the present invention is described that the end portions 1701e, 1702, 2701e and 2702e of the pixel defining patterns 1700 and 2700 can be extended to the inside of the first device passivation layer 1150 and the second device passivation layer 2150. However, the display device according to yet another embodiment of the present invention can further include upper passivation layers 1160 and 2160 which can be disposed on the corresponding device passivation layer 1150 and 2150, and can be extended along surfaces of the corresponding color filter 1500 and 2500, and the corresponding pixel defining pattern 1700 and 2700, as shown in FIG. 7. For example, the display device according to yet another embodiment of the present invention can include a first upper passivation layer 1160 which surrounds the second pattern end 1702e of the first pixel defining pattern 1700 and can be in contact with an upper surface of the first color filter 1500 facing the second substrate 2100, and a second upper passivation layer 2160 which surrounds the second pattern end 2702e of the second pixel defining pattern 2700 and can be in contact with a lower surface of the second color filter 2500 facing the first substrate 1100. Thus, in the display device according to yet another embodiment of the present invention, the movement, the defect and the damage of the color filters 1500 and 2500 by a process of coupling between the first substrate 1100 and the second substrate 2100 can be prevented or reduced.

Figure 8:
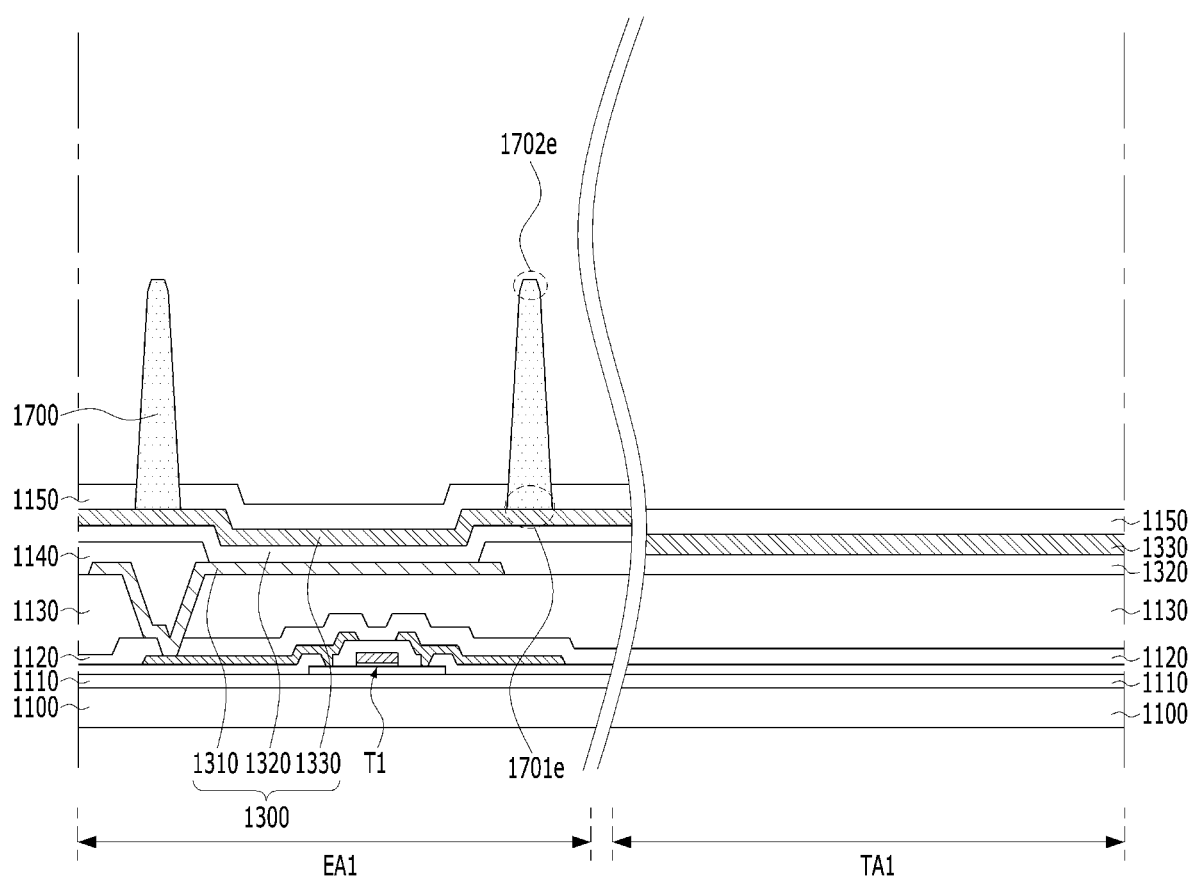
FIGS. 8 to 10 are views sequentially showing a method of forming the display device according to FIG. 5.
Figure 9:
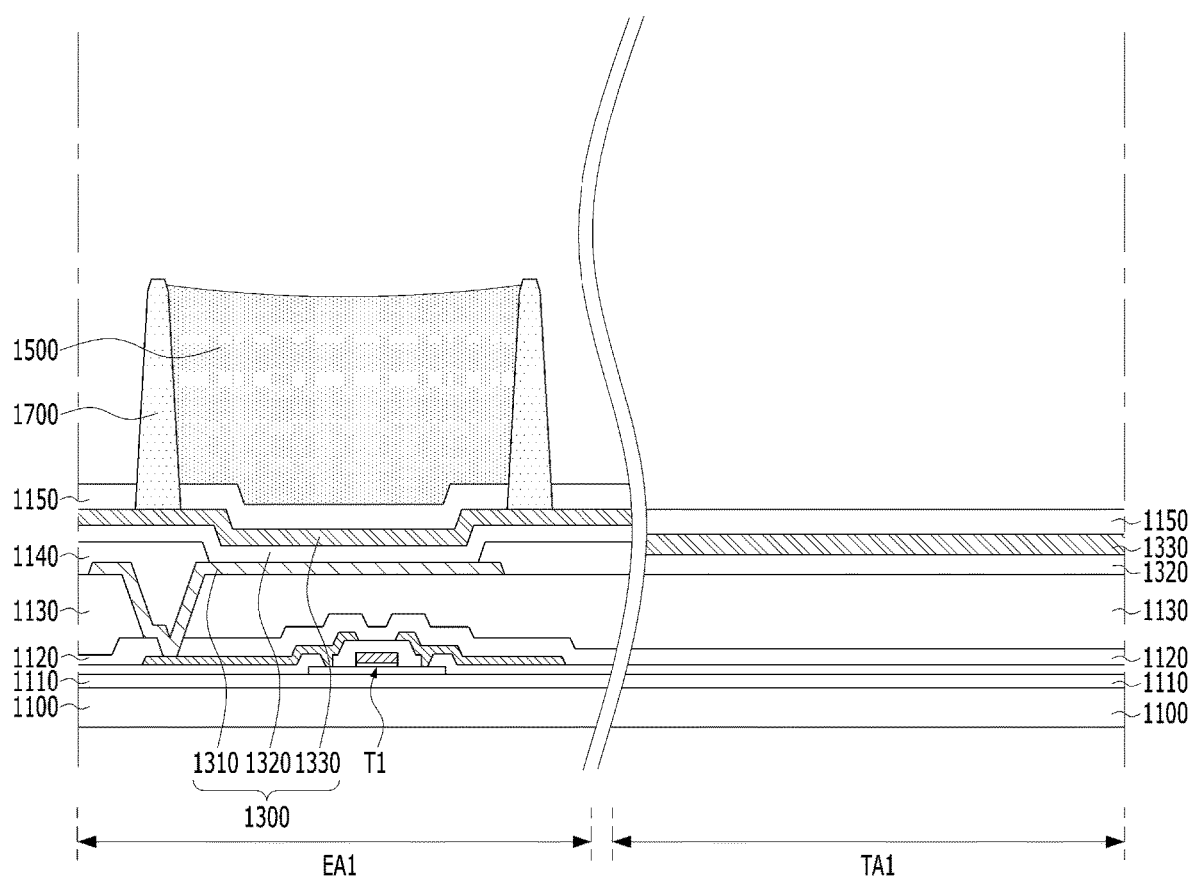
Figure 10:
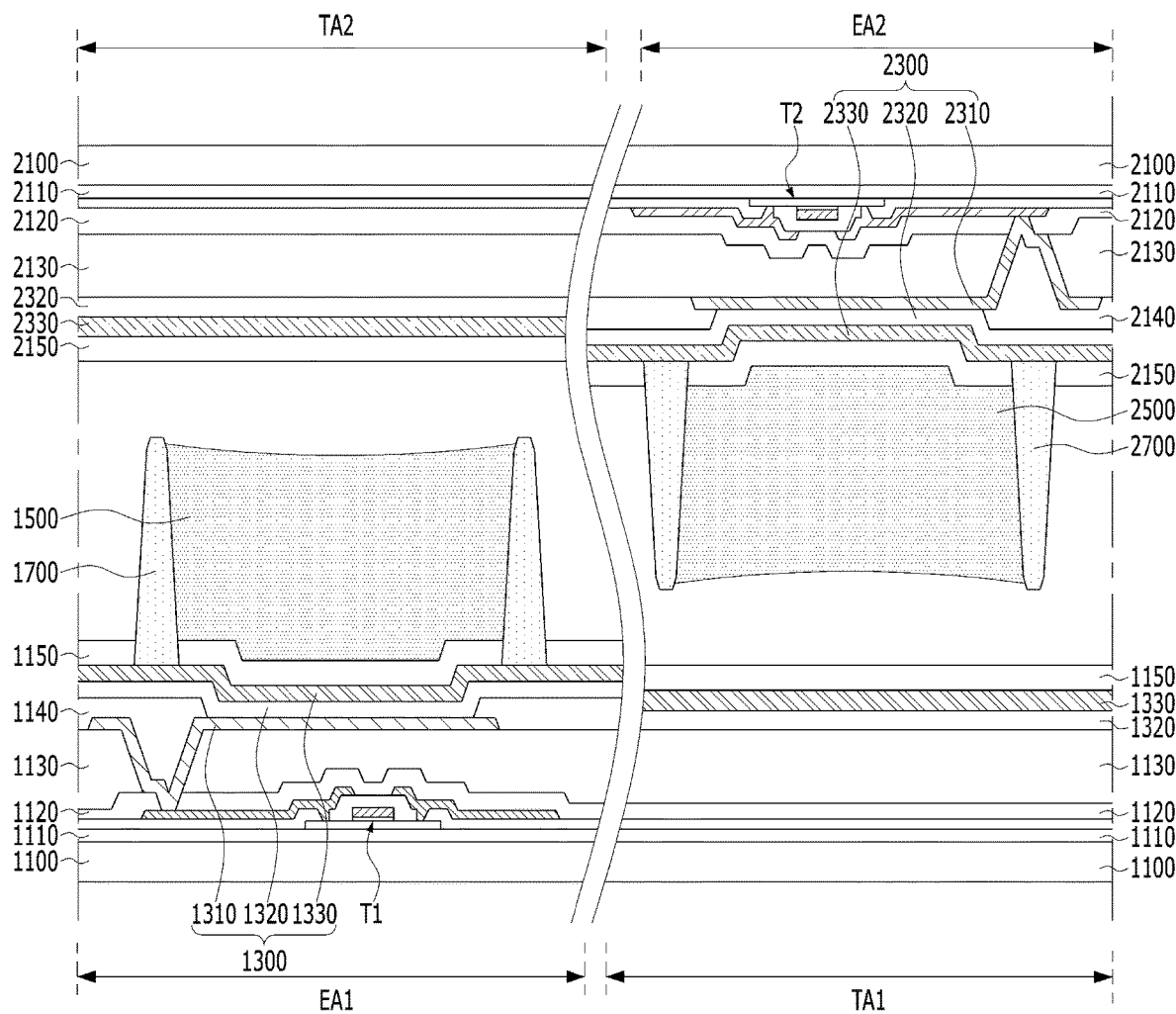

FIGS. 8 to 10 are views sequentially showing a method of forming the display device according to FIG. 5.

A method for forming the display device according to the embodiment of the present invention will be described with reference to FIGS. 5 and 8 to 10. First, as shown in FIG. 8, the method for forming the display device according to the embodiment of the present invention can include an operation of preparing a first substrate 1100 including a first emitting area EA1 and a first transmitting area TA1, an operation of sequentially forming a first buffer layer 1110, a driving circuit including a first driving thin film transistor T1, a first lower passivation layer 1120 and a first over-coat layer 1130 on the first emitting area EA1 of the first substrate 1100, an operation of forming a first lower electrode 1310 connected to the first thin film transistor T1 on the first over-coat layer 1130, an operation of a first bank insulating layer 1140 covering an edge of the first lower electrode 1310 on the first over-coat layer 1130, an operation of forming the first light-emitting layer 1320 and a first upper electrode 1330 on the first lower electrode 1310 and the first bank insulating layer 1140, and an operation of forming a first pixel defining pattern 1700 and a first device passivation layer 1150 on the first upper electrode 1330.

The operation of forming a first pixel defining pattern 1700 and a first device passivation layer 1150 can include an operation of the first pixel defining pattern 1700 on the first upper electrode 1330, and an operation of the first device passivation layer 1150 on the first substrate 1100 on which the first pixel defining pattern 1700. Thus, in the method of forming the display device according to the embodiment of the present invention, the first device passivation layer 1150 can be disposed close to the first pattern end 1701e of the first pixel defining pattern 1700 which can be in direct contact with the first upper electrode 1330. Therefore, in the method of forming the display device according to the embodiment of the present invention, the first pattern end 1701e of the first pixel defining pattern 1700 can be fixed on the first upper electrode 1330 by the first device passivation layer 1150, firmly.

As shown in FIG. 9, the method of forming the display device according to the embodiment of the present invention can include an operation of forming a first color filter 1600 in a space defined by the first pixel defining pattern 1700.

The operation of forming the first color filter 1600 can include an operation of filling a space defined by the first pixel defining pattern 1700 with a material for the formation of the first color filter 1600, and an operation of curing the material for the formation of the first color filter 1600. For example, the operation of the first color filter 1600 can include an inkjet process. Thus, in the method of forming the display device according to the embodiment of the present invention, the space defined by the first pixel defining pattern 1700 can be filled by the first color filter 1600.

As shown in FIG. 10, the method of forming the display device according to the embodiment of the present invention can include an operation of aligning a second substrate 2100 in which a second buffer layer 1110, a driving circuit including a second driving thin film transistor T2, a second lower passivation layer 2120 and a second over-coat layer 2130 can be formed, on the first substrate 1100 in which the first color filter 1600 and the first pixel defining pattern 1700 can be formed.

The second substrate 2100 can be formed by a process the same as the first substrate 1100. For example, the second light-emitting element 2300 and the second color filter 2500 can be formed on a second emitting area EA2 of the second substrate 2100.

The first substrate 1100 and the second substrate 2100 can be aligned such that the second light-emitting element 2300 can be staggered with the first light-emitting element 1300. For example, the second substrate 2100 can be aligned such that the second light-emitting element 2300 can be disposed on the first transmitting area TA1 of the first substrate 1100.

As shown in FIG. 5, the method of forming the display device according to the embodiment of the present invention can include an operation of coupling the first substrate 1100 on which the first light-emitting element 1300, the first color filter 1600 and the first pixel defining pattern 1700 can be formed, and the second substrate 2100 on which the second light-emitting element 2300, the second color filter 2600 and the second pixel defining pattern 2700 by using a filling member 3000.

The operation of coupling the first substrate 1100 and the second substrate 2100 can include an operation of applying a pressure to the first substrate 1100 and the second substrate 2100. For example, a second pattern end 1702e of the first pixel defining pattern 1700 can be inserted to the inside of the second device passivation layer 2150, and a second pattern end 2702e of the second pixel defining pattern 2700 can be inserted to the inside of the first device passivation layer 1150, by the operation of coupling the first substrate 1100 and the second substrate 2100. Thus, in the method of forming the display device according to the embodiment of the present invention, each of the color filters 1500 and 2500 can completely fill a space defined by the first device passivation layer 1150, the second device passivation layer 2150 and the corresponding pixel defining pattern 1700 and 2700. Thus, in the method of forming the display device according to the embodiment of the present invention, a distance between the first substrate 1100 and the second substrate 2100 which can be coupled, can be kept constant by the color filters 1500 and 2500, and the filling member 3000.

Accordingly, the method of forming the display device according to the embodiment of the present invention can include a pressing process to couple the first substrate 1100 including a space filled by the first color filter 1500 between the first pixel defining pattern 1700, and the second substrates 2100 including a space filled by the second color filter 2500 between the second pixel defining pattern 2700. Thus, in the method of forming the display device according to the embodiment of the present invention, the space defined by the first device passivation layer 1150, the second device passivation layer 2150, and the pixel defining patterns 1700 and 2700 can be completely filled by the corresponding color filter 1500 and 2500, and the location of the pattern ends 1701e, 1702e, 2701e and 2702e of each pixel defining pattern 1700 and 2700 can be firmly fixed. Thus, in the method of forming the display device according to the embodiment of the present invention, the distortion between the first substrate and the second substrate due to the external impact can be prevented or reduced. In embodiments of the present invention, the wider end of the pixel defining pattern can be closer to the light-emitting element than the narrower end.

In the result, the display device according to the embodiments of the present invention and the method of forming the same can include pixel defining patterns having pattern ends inserted to the inside of the corresponding device passivation layer, and color filters completely filling the space defined by the device passivation layers and the corresponding pixel defining pattern. Thus, in the display device according to the embodiments of the present invention and the method of forming the same, the distortion between the first substrate and the second substrate can be prevented or reduced by the pixel defining patterns and the color filters. Thereby, in the display device according to the embodiment of the present invention and the method of forming the same, the degradation of the color sense and the quality of the realized image due to the external impact can be prevented or reduced.

What is claimed is:

1. A display device comprising:
a bank insulating layer on a first substrate, the bank insulating layer including an opening;
a light-emitting element including a first electrode, a light-emitting layer and a second electrode, which are sequentially stacked within the opening of the bank insulating layer;
a first device passivation layer on the bank insulating layer and the light-emitting element;
a color filter on the first device passivation layer, the color filter overlapping with the light-emitting element;
a filling member on the first device passivation layer, the filling member surrounding a side surface of the color filter;
a second device passivation layer on the color filter and the filling member;
a pixel defining pattern extending between the first device passivation layer and the second device passivation layer, and the pixel defining pattern interposed between the color filter and the filling member; and
a second substrate on the second device passivation layer,
wherein the filling member is disposed outside the light-emitting element and does not overlap with any light-emitting element,
wherein a vertical length of the pixel defining pattern is longer than a vertical distance between the first device passivation layer and the second device passivation layer,
wherein the color filter is in contact with the first device passivation layer, the second device passivation layer and the pixel defining pattern,
wherein a side surface of the pixel defining pattern includes a first side and a second side, the second side having an inclined angle different from an inclined angle of the first side,
wherein the pixel defining pattern includes a narrow end and a wide end having a width larger than the narrow end,
wherein an inflection point between the first side and the second side of the pixel defining pattern is disposed close to the narrow end of the pixel defining pattern, and
wherein the second side of the pixel defining pattern is surrounded by the second device passivation layer.

2. The display device according to claim 1, wherein an end portion the wide end of the pixel defining pattern is in direct contact with the second electrode.

3. The display device according to claim 2, wherein a horizontal width of the pixel defining pattern is reduced towards the second device passivation layer and away from the first device passivation layer.

4. The display device according to claim 2, wherein the bank insulating layer covers an edge of the first electrode, and
wherein the pixel defining pattern and the filling member overlap the bank insulating layer.

5. The display device according to claim 1, wherein the filling member includes an adhesive material.

6. The display device according to claim 1, wherein the inclined angle of the second side is smaller than the inclined angle of the first side.

7. The display device according to claim 1, wherein a vertical distance of the second side is smaller than a vertical length of the second device passivation layer.

8. The display device according to claim 1, wherein the pixel defining pattern includes a material harder than the filling member.

9. The display device according to claim 1,
wherein the narrow end of the pixel defining pattern penetrates into the second device passivation layer without piercing the second device passivation layer, and
wherein a lower surface of the wider wide end of the pixel defining pattern is in direct contact with the second electrode.

10. The display device according to claim 1, wherein the wide end of the pixel defining pattern pierces the first device passivation layer.

11. The display device according to claim 1, wherein among the first and second sides of the side surface of the pixel defining pattern, only the second side is surrounded by the second device passivation layer and an entirety of the second side is in contact with the second device passivation layer.

12. The display device according to claim 1, wherein the first side of the pixel defining pattern is connected to the second side of the pixel defining pattern at a vertex, and the vertex is disposed at a location corresponding to an interface between the second passivation layer and the color filter or at a location corresponding to an interface between the second passivation layer and the filling member.

13. The display device according to claim 1, wherein a cross section of the pixel defining pattern is a hexagon having two acute interior angles and four obtuse interior angles, and wherein the four obtuse interior angles form a tapered tip of the pixel defining pattern, and the tapered tip of the pixel defining pattern protrudes into the second passivation layer.

14. A display device comprising:
a first color filter between a first substrate and a second substrate;
a first pixel defining pattern on a side surface of the first color filter, the first pixel defining pattern including a first narrow end and a first wide end having a width larger than the first narrow end;
a first device passivation layer between the first substrate and the first color filter, the first device passivation layer surrounding the first wine end of the first pixel defining pattern;
a first bank insulating layer between the first substrate and the first device passivation layer, the first bank insulating layer including a first opening which overlaps the first color filter;
a first light-emitting element between the first substrate and the first device passivation layer, the first light-emitting element including a first electrode, a first light-emitting layer and a second electrode, which are sequentially stacked within the first opening of the first bank insulating layer; and
a second device passivation layer between the first color filter and the second substrate, the second device passivation layer surrounding the first narrow end of the first pixel defining pattern,
wherein a space by the first device passivation layer, the second device passivation layer and the first pixel defining pattern is completely filled by the first color filter, so that the first color filter is in contact with the first device passivation layer, the second device passivation layer and the pixel defining pattern,
wherein a side surface of the first pixel defining pattern includes a first side and a second side, the second side having an inclined angle different from an inclined angle of the first side,
wherein an inflection point between the first side and the second side of the first pixel defining pattern is disposed close to the first narrow end of the first pixel defining pattern, and
wherein the second side of the first pixel defining pattern is surrounded by the second device passivation layer.

15. The display device according to claim 14, wherein the first pixel defining pattern includes a material having black color.

16. The display device according to claim 14, further comprising:
a second color filter between the first substrate and the second substrate, the second color filter being spaced away from the first color filter;
a second pixel defining pattern on a side surface of the second color filter, the second pixel defining pattern being spaced away from the first pixel defining pattern;
a second bank insulating layer between the second device passivation layer and the second substrate, the second bank insulating layer including a second opening which overlaps the second color filter; and
a second light-emitting element between the second device passivation layer and the second substrate, the second light-emitting element including a third electrode, a second light-emitting layer and a fourth electrode, which are sequentially stacked within the second opening of the second bank insulating layer,
wherein the second pixel defining pattern includes a second narrow end and a second wide end having a width larger than the second narrow end, and
wherein the second pixel defining pattern is symmetric with the first pixel defining pattern.

17. The display device according to claim 16, further comprising a filling member between the first device passivation layer and the second device passivation layer, the filling member surrounding the first pixel defining pattern and the second pixel defining pattern,
wherein the filling member is disposed outside the first light-emitting element and the second light-emitting element, and the filling member does not overlap with any light-emitting element.

18. The display device according to claim 17, wherein the filling member includes an adhesive material.

19. The display device according to claim 16, wherein a side surface of the second pixel defining pattern includes a third side and a fourth side, the fourth side having an inclined angle different from an inclined angle of the third side,
wherein an inflection point between the third side and the fourth side of the second pixel defining pattern is disposed close to the second narrow end of the second pixel defining pattern, and
wherein the fourth side of the first pixel defining pattern is surrounded by the first device passivation layer.

* * * * *